(12) United States Patent
Misawa et al.

(10) Patent No.: US 7,629,566 B2
(45) Date of Patent: Dec. 8, 2009

(54) SOLID STATE IMAGING DEVICE WITH IMPROVED HEAT RADIATION

(75) Inventors: Takeshi Misawa, Saitama (JP); Yoshihiro Ito, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 20 days.

(21) Appl. No.: 11/443,343

(22) Filed: May 31, 2006

(65) Prior Publication Data
US 2006/0266930 A1 Nov. 30, 2006

(30) Foreign Application Priority Data
May 31, 2005 (JP) ............................. 2005-158836

(51) Int. Cl.
  *G01J 1/44* (2006.01)
  *H01L 27/00* (2006.01)
  *H01L 31/062* (2006.01)
(52) U.S. Cl. ............................... 250/214 R; 250/208.1; 257/294
(58) Field of Classification Search ................. 250/238, 250/239, 214.1, 214 A, 208.1, 216, 226, 214 R; 257/435, 675, 290, 291, 294; 165/104.33; 348/269–273, 290, 294; 358/482, 483, 515
See application file for complete search history.

(56) References Cited

U.S. PATENT DOCUMENTS

| | | | | |
|---|---|---|---|---|
| 5,079,635 A | * | 1/1992 | Koshiyouji et al. | ......... 348/340 |
| 5,500,540 A | * | 3/1996 | Jewell et al. | ................... 257/82 |
| 5,981,933 A | * | 11/1999 | Chamberlain et al. | .... 250/208.1 |
| 6,326,610 B1 | * | 12/2001 | Muramatsu et al. | ......... 250/238 |
| 6,330,908 B1 | * | 12/2001 | Lee et al. | ..................... 165/185 |
| 6,525,409 B1 | | 2/2003 | Matsuo | |
| 6,919,504 B2 | * | 7/2005 | McCutcheon et al. | ...... 174/16.3 |
| 7,183,531 B2 | * | 2/2007 | Olsen et al. | .............. 250/208.1 |
| 2003/0189098 A1 | * | 10/2003 | Tsikos et al. | ................. 235/454 |
| 2004/0226691 A1 | * | 11/2004 | Lee et al. | .................... 165/80.3 |
| 2005/0128710 A1 | * | 6/2005 | Beitelmal et al. | ........... 361/709 |
| 2005/0146003 A1 | * | 7/2005 | O'Connor et al. | ........... 257/678 |

FOREIGN PATENT DOCUMENTS

| | | | |
|---|---|---|---|
| JP | 61090459 A | * | 5/1986 |
| JP | 2000-223603 A | | 8/2000 |

* cited by examiner

*Primary Examiner*—Georgia Y Epps
*Assistant Examiner*—Don Williams
(74) *Attorney, Agent, or Firm*—Sughrue Mion, PLLC

(57) ABSTRACT

Formed on a semiconductor substrate is a CCD image sensor. The CCD image sensor has photodiodes arranged in a matrix form, a transfer path for transferring signal charges generated by the photodiodes, and an output amplifier for amplifying and outputting the signal charges. The transfer path and the output amplifier are covered with a light shielding film. This light shielding film has integral radiation fins.

18 Claims, 8 Drawing Sheets

SOLID STATE IMAGING DEVICE WITH IMPROVED HEAT RADIATION

BACKGROUND OF THE INVENTION

1. Field of the Invention

The present invention relates to a solid state imaging device for digital cameras or the like, and more particularly to a solid state imaging device with an improved heat radiation performance.

2. Background Arts

Digital cameras use solid state imaging devices, such as a CCD image sensor, to convert images into digital image data and store it in recording media such as built-in memory and memory cards. The solid state imaging devices, whether the CCD image sensors or CMOS image sensors, generally have a light receiving area with photodiodes arranged thereon in a matrix form, a charge transfer section for transferring signal charges from the light receiving area, and an amplifier that amplifies the signal charges coming from the charge transfer section.

Recent advance in technology promotes the solid state imaging devices to have more pixels while get more downsized, and therefore the solid state imaging devices become to generate more heat. There are the Japanese patent laid-open publication No. 2000-223603 and the U.S. Pat. No. 6,525,409 (corresponding to the Japanese patent laid-open publication No. 2001-68578) that disclose structures for cooling the solid state imaging devices to prevent excessive heat generation thereof. The solid state imaging device, disclosed in the publication No. 2000-223603, is composed of a CCD image sensor chip (semiconductor substrate), a metal land on which the CCD image sensor chip is mounted, and a package that seals the CCD image sensor chip and the metal land. This package is provided with an opening that exposes the metal land, and the heat of the CCD image sensor chip is dissipated from the opening through the metal land. The CCD package disclosed in the U.S. Pat. No. 6,525,409, on the other hand, includes a metal radiation member that makes contact with the CCD image sensor chip (semiconductor substrate). The heat of the CCD image sensor chip is dissipated through this radiation member.

While the above structures are both intended for cooling the entire device, high heat generating components such as the amplifier and the like are not concerned individually. Accordingly, their heat radiation performance is insufficient.

SUMMARY OF THE INVENTION

In view of the foregoing, an object of the present invention is to provide a solid state imaging device capable of providing an adequate heat radiation performance.

To achieve the above and other objects, the solid state imaging device according to the present invention includes an image sensor having a plurality of light receiving elements arranged in a matrix form, a light shield which partially covers the image sensor for light protection, and radiation fins integrally formed on the light shield.

In a preferred embodiment of the present invention, the image sensor is a CCD image sensor, which includes the light receiving elements, vertical transfer electrodes for transferring signal charges accumulated in the light receiving elements in a vertical direction, horizontal transfer electrodes connected vertical to the vertical transfer electrodes and transferring the signal charges from the vertical transfer electrodes in a horizontal direction, and an output amplifier for amplifying and outputting the signal charges from the horizontal transfer electrodes. The light shield covers the amplifier and the horizontal transfer electrodes, whereas the radiation fins are disposed above the amplifier. It is preferable to dispose the radiation fins above the horizontal transfer electrodes as well.

In another embodiment of the present invention, the image sensor is a CMOS image sensor, which includes the light receiving elements, pixel amplifiers provided for each light receiving element to amplify the signal charge and output it as an image signal, pixel selectors for selectively reading out the image signals sequentially on a pixel basis, an output amplifier for amplifying the image signals read out by the pixel selectors, and an A/D converter for converting the image signals into digital data. The light shield covers either the output amplifier alone or the A/D converter as well as the output amplifier. The radiation fins are disposed above the output amplifier. Additionally, the CMOS image sensor is provided with a noise reduction processor, such as a correlation double sampling circuit. It is preferable that the light shield also covers the noise reduction processor, and that the radiation fins are disposed above the noise reduction processor as well.

According to the present invention, the light shield that covers a part of the image sensor is provided with the integral radiation fins. The radiation fins dissipate the heat of the image sensor, and the heat radiation performance therefore becomes adequate.

For the CCD image sensor, the light shield covers the output amplifier and the horizontal transfer electrodes, whereas the radiation fins are disposed at least above the output amplifier. Since the heat of the output amplifier, the high heat generating component, is dissipated through the radiation fins, the temperature rise in the solid state imaging device can be prevented.

For the CMOS image sensor, the light shield covers the output amplifier, the A/D converter, and the noise reduction processor, whereas the radiation fins are disposed at least above the output amplifier. If disposed above the A/D converter and the noise reduction processor as well, the radiation fins dissipate the heat of the output amplifier, the A/D converter, and the noise reduction processor, which are all high heat generating components.

BRIEF DESCRIPTION OF THE DRAWINGS

For more complete understanding of the present invention, and the advantage thereof, reference is now made to the following descriptions taken in conjunction with the accompanying drawings, in which.

DESCRIPTION OF THE PREFERRED EMBODIMENTS

Figure 1:
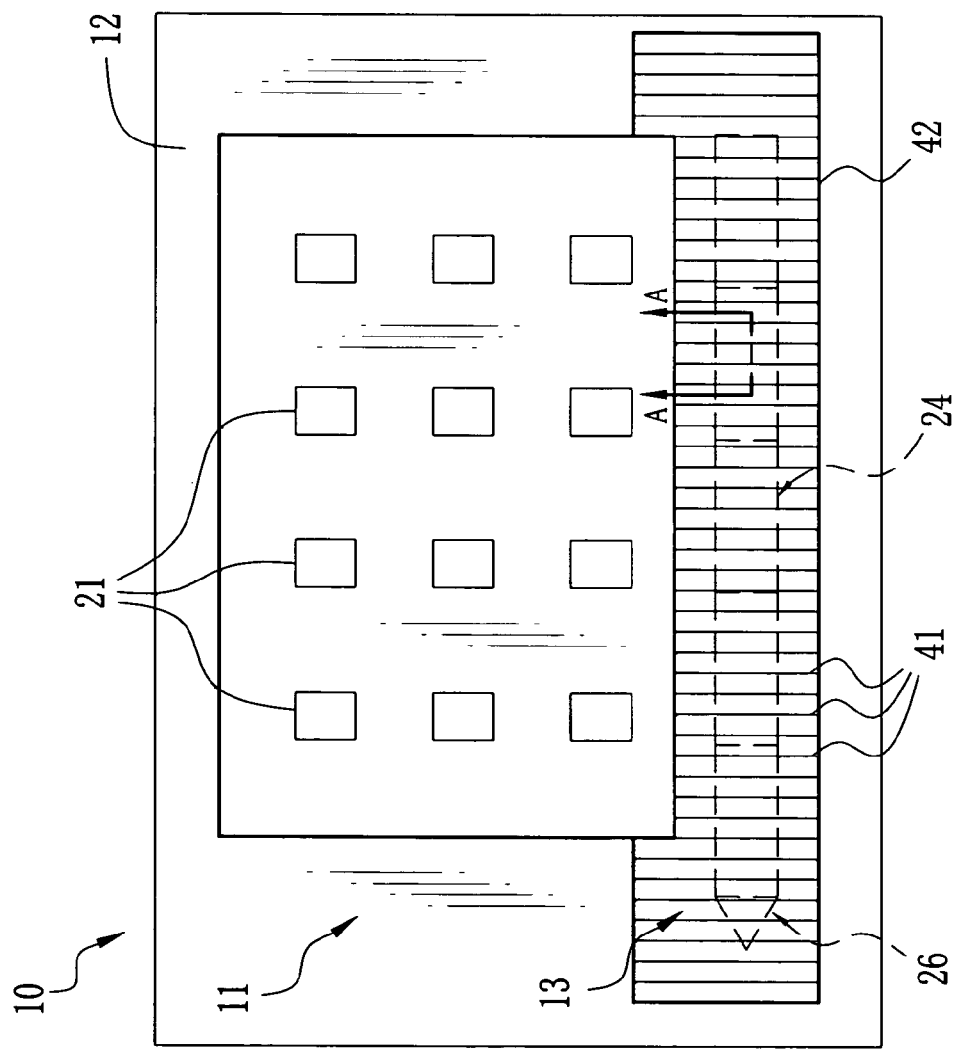
FIG. 1 is a front view of a solid state imaging device according to the present invention.

Referring to FIG. 1, a solid state imaging device 10 includes a semiconductor substrate 12 having a CCD image sensor 11 formed thereon and a radiation section 13 which covers a part of the CCD image sensor 11. The radiation section 13 is disposed according to the positions of a horizontal transfer path 24 and an output amplifier 26 both described below.

Figure 2:
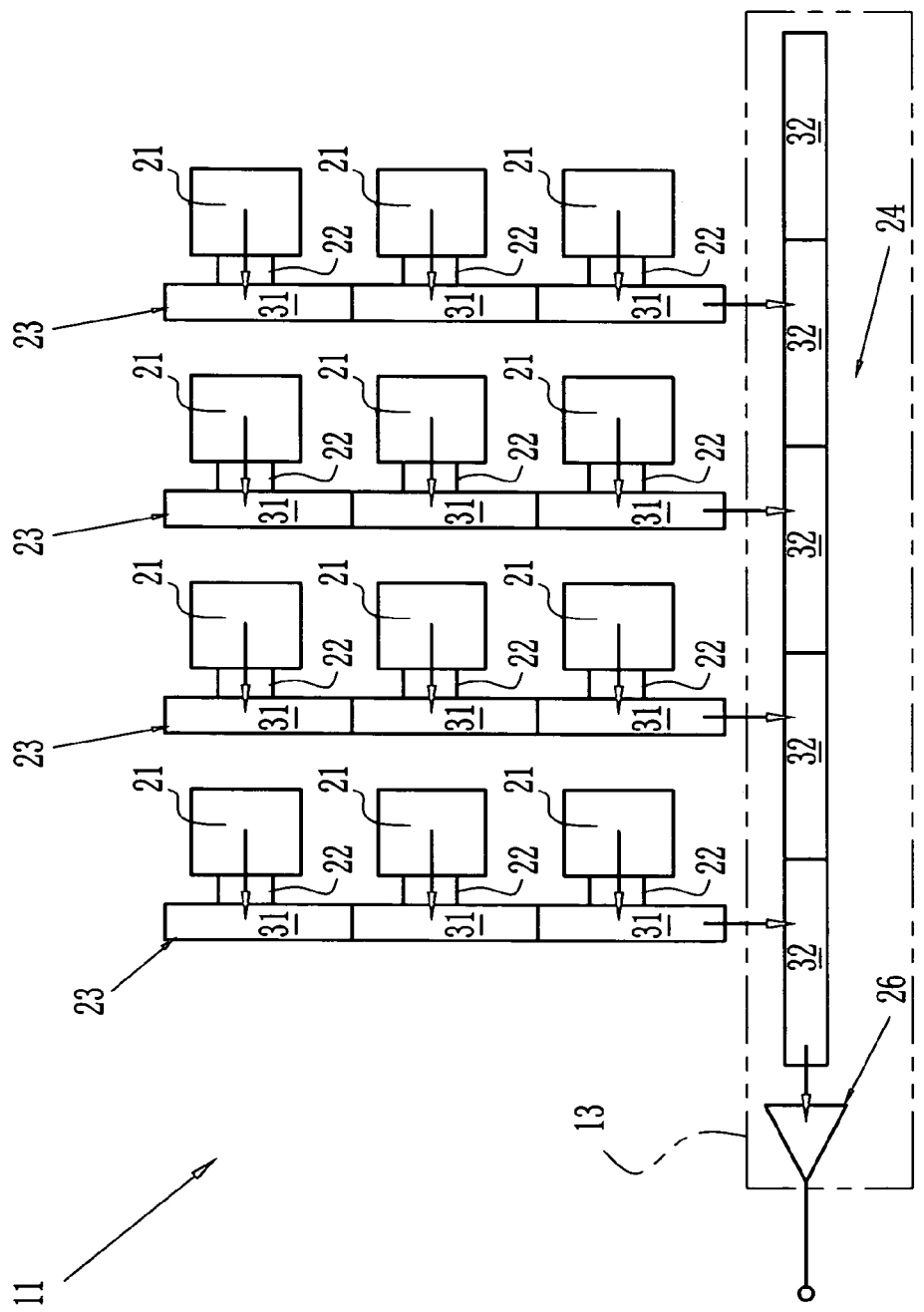
FIG. 2 is a block diagram of an electrical structure of a CCD image sensor.

As shown in FIG. 2, the CCD image sensor 11 includes light receiving elements 21 arranged in a matrix form, field shift gates 22, vertical transfer paths (vertical shift registers) 23, a horizontal transfer path (horizontal shift register) 24, and an output amplifier 26.

Each light receiving element 21 converts incident light into signal charge and stores it. The light receiving elements 21 are, for example, photodiodes. Although the CCD image sensor 11 in FIG. 1 and FIG. 2 has twelve (3×4) pieces of the light receiving elements 21, the CCD image sensor in reality has millions of the light receiving elements 21.

The field shift gates 22 are gating members, which are normally closed to prevent the leakage of the signal charges in the light receiving elements 21 out to the vertical transfer paths 23, and at the time of signal transfer they opens to allow the signal charges to flow into the vertical transfer paths 23. Each of the field shift gate 22 opens during it receives a field shift pulse from a CCD drive circuit (not shown), and thereby the signal charge is transferred to the horizontal transfer path 24.

The vertical transfer path 23 has vertical transfer electrodes 31 made for each light receiving element 21, and transfers the signal charges in a vertical direction. Each vertical transfer electrode 31 is connected to one of the above described field shift gates 22, and sends the signal charge to the horizontal transfer path 24 when it receives a vertical drive signal from the CCD drive circuit.

The horizontal transfer path 24 is composed of horizontal transfer electrodes 32, which are connected to the vertical transfer paths 23, and transfers the signal charges in a horizontal direction perpendicular to the transfer direction of the vertical transfer paths 23. Each horizontal transfer electrode 32 operates when it receives a horizontal drive signal from the CCD drive circuit, and transfers the signal charges from the vertical transfer path 23 to the output amplifier 26. The output amplifier 26 amplifies and outputs the signal charges coming from the horizontal transfer path 24.

Figure 3:
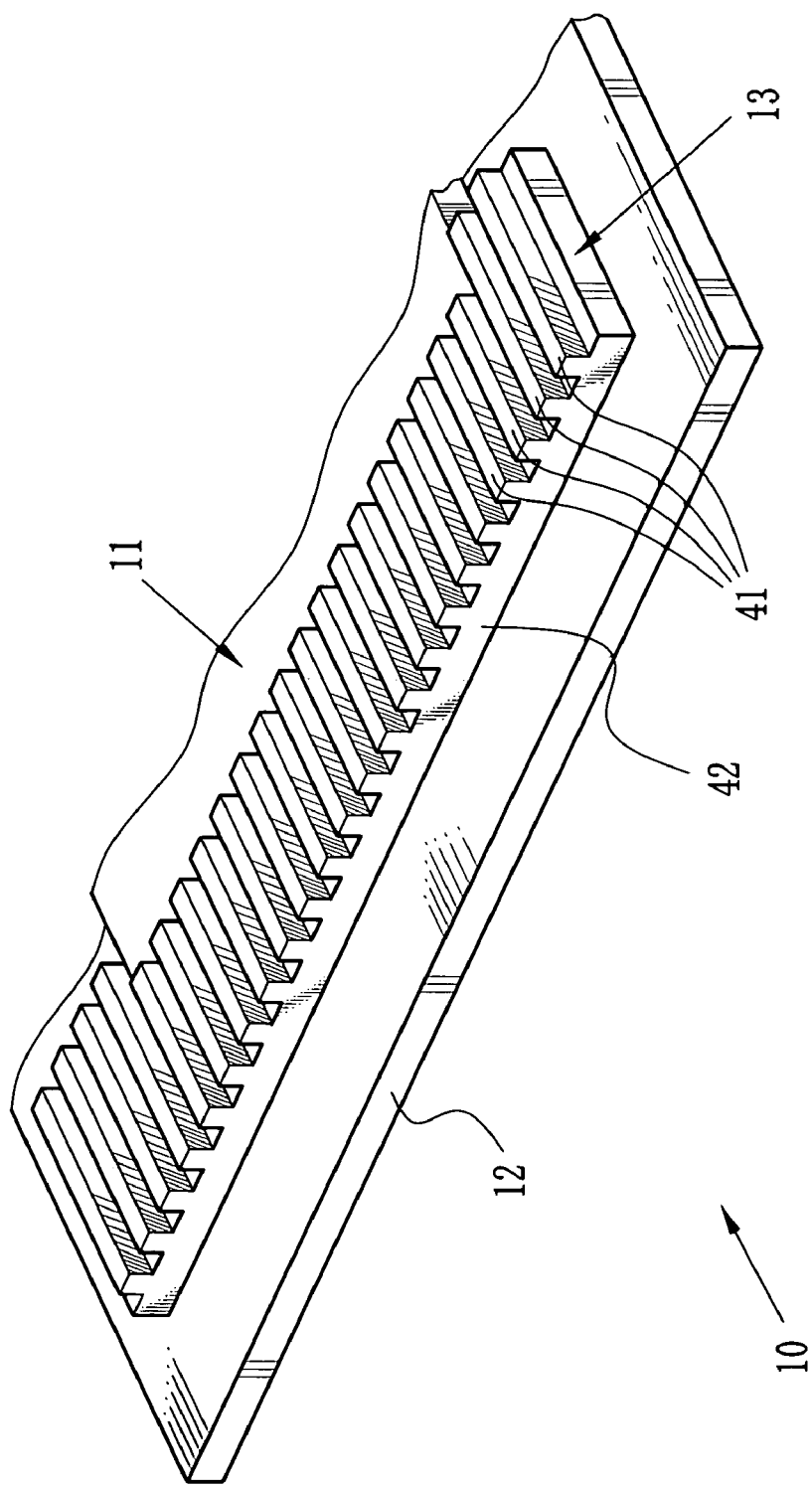
FIG. 3 is a perspective view of radiation fins.

The horizontal transfer path 24 and the output amplifier 26 generate more heat than other components in the CCD image sensor 11. In this embodiment, temperature rise of the CCD image sensor 11 is restrained by the radiation section 13. As shown in FIG. 3, the radiation section 13 is formed with a plurality of radiation fins 41.

Figure 4:
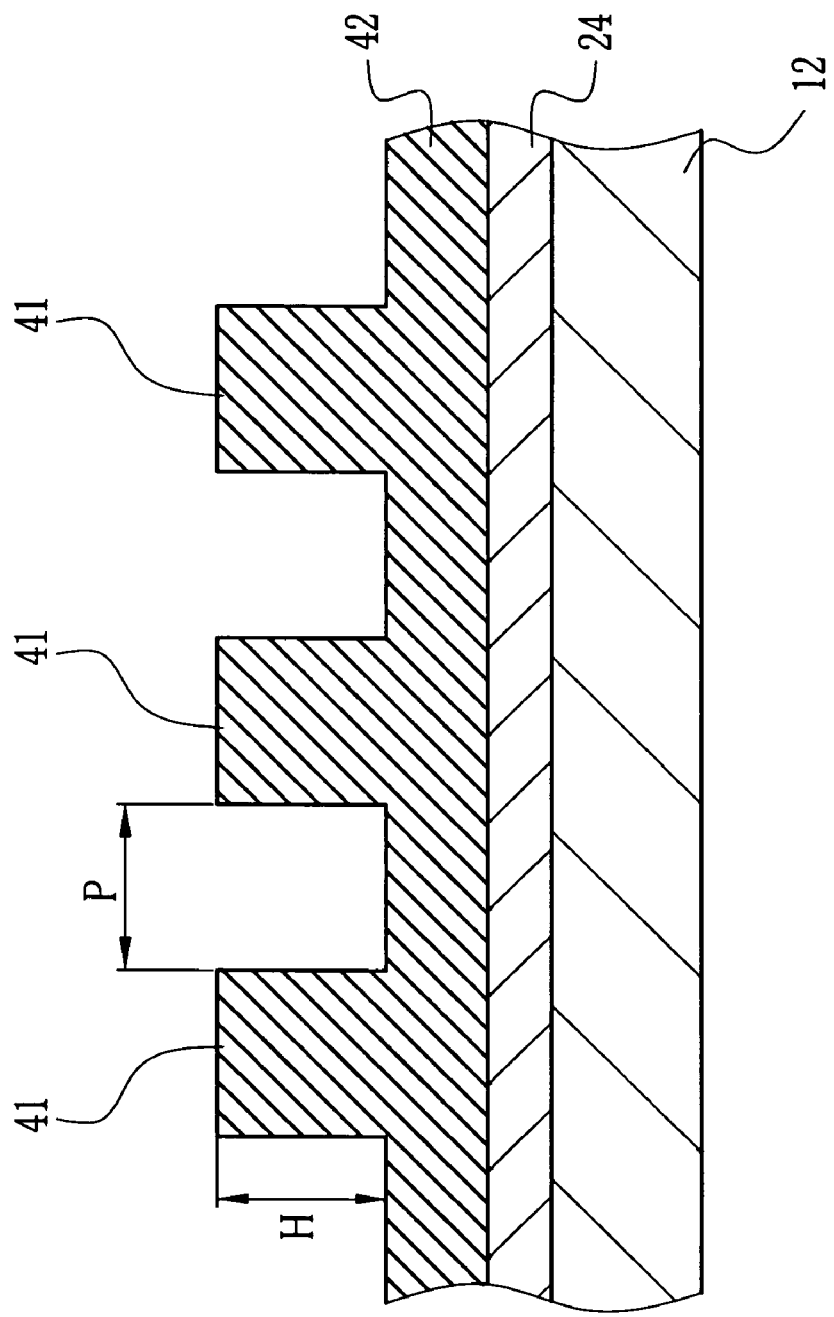
FIG. 4 is a cross sectional view of the radiation fins.

The radiation fins 41, as shown in FIG. 4, are integrated with a light shielding film 42, which covers the horizontal transfer path 24 and the output amplifier 26. Made from a metallic material, such as aluminum, by a sputtering method or an etching method, the light shielding film 42 blocks light toward the horizontal transfer path 24 and the output amplifier 26. The light shielding film 42 is firstly formed to have extra thickness for the formation of the radiation fins 41, which are then formed integrally on the upper surface of the light shielding film 42 by the etching method. In this embodiment, the radiation fins 41 are rectangular columns aligned parallel to each other at regular intervals. Additionally, an insulating film (not shown) is formed above the horizontal transfer path 24 and the output amplifier 26.

The operation of the above constitution is now described. Image capturing with the solid state imaging device in a digital camera or the like is initiated by pressing a shutter release button for exposure (accumulation of the signal charges in the light receiving elements 21). When the light receiving elements 21 complete the exposure, the field shift gates 22 are opened and the signal charges flow into the vertical transfer paths 23. The signal charges go through the horizontal transfer path 24 and reach the output amplifier 26, where they are amplified and output as analog signals. These analog signals are converted into digital signals to form image data. Since a color image sensor has a color filter on light receiving elements 21, the solid state imaging device outputs the signals of RGB.

Because the solid state imaging device 10 transfers and outputs the signal charges at high speed in this manner, the horizontal transfer path 24 and the output amplifier 26 generate heat. In particular, the output amplifier 26 consumes large power, and thus generates a lot of heat. However, as described above, the horizontal transfer path 24 and the output amplifier 26 are covered by the light shielding film 42 which has the integral radiation fins 41, the heat of the transfer path 24 and the output amplifier 26 is thus conducted to the light shielding film 42 and effectively dissipated through the radiation fins 41.

It is noted that the heat is dissipated more effectively if the interval P (mm) between the radiation fins 41 satisfies the following equation 1;

$$P = 5 \times \left(\frac{H}{\Delta T}\right)^{0.25} \quad \text{(Equation 1)}$$

Wherein H (mm) represents the height of the radiation fin 41, whereas $\Delta T$ (° C.) represents an average temperature rise of the radiation section 13.

Although the radiation fins 41 are formed above the transfer path 24 and the output amplifier 26 in the above embodiment, the present invention is not limited to this. The radiation fins 41 may be formed at least above the output amplifier 26, and the heat radiation performance is still better than the conventional devices.

Figure 5:
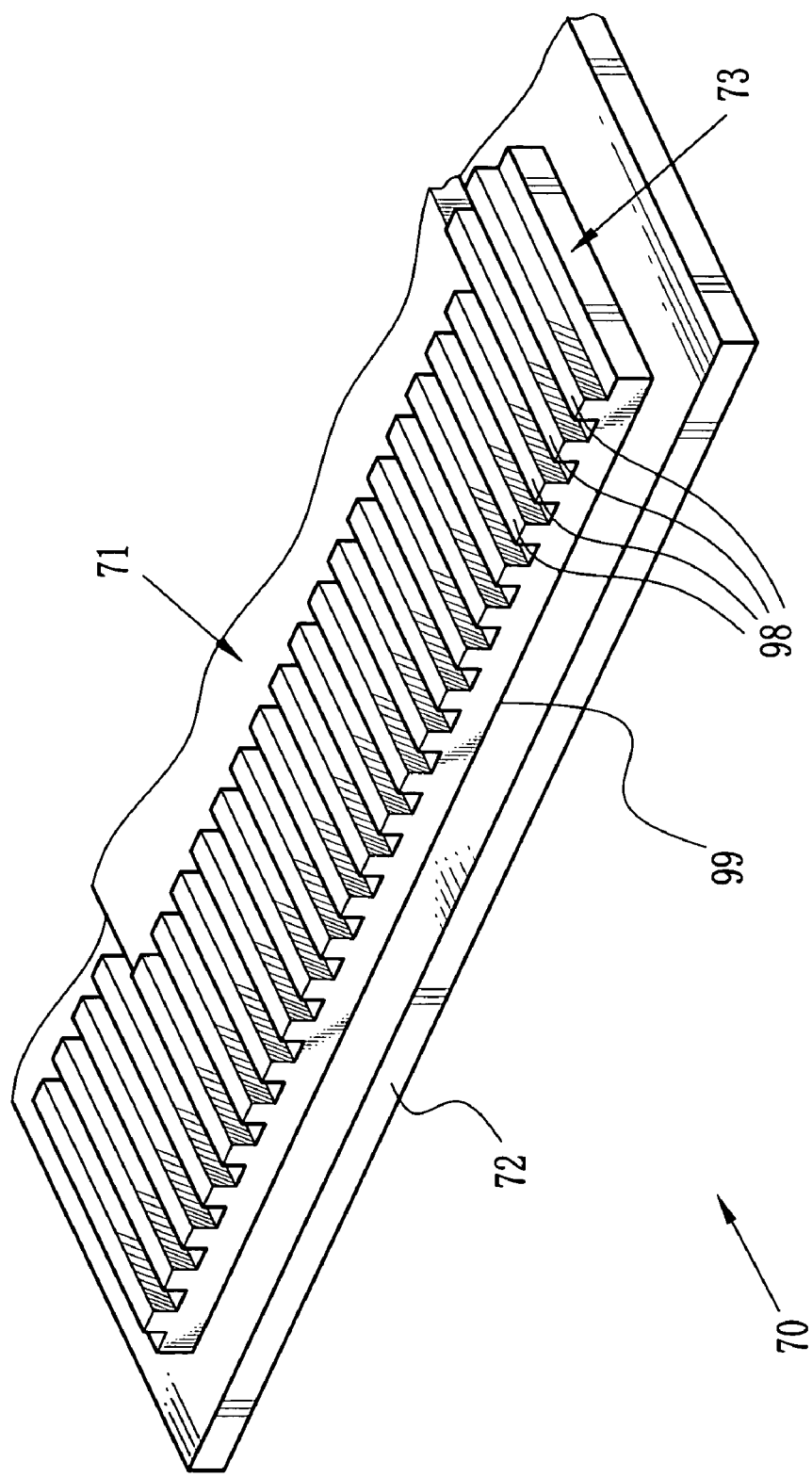
FIG. 5 is a perspective view of a solid state imaging device according to another embodiment of the present invention.

As shown in FIG. 5, the present invention is also applicable to the solid state imaging device provided with a CMOS image sensor. A solid state imaging device 70 includes a semiconductor substrate 72 having a CMOS image sensor 71 (see FIG. 6) formed thereon and a radiation section 73 which covers a part of the CMOS image sensor 71. The radiation section 73 is disposed according to the positions of an output amplifier 91, a noise reduction circuit 92, and an A/D converter 93 all described below.

Figure 6:
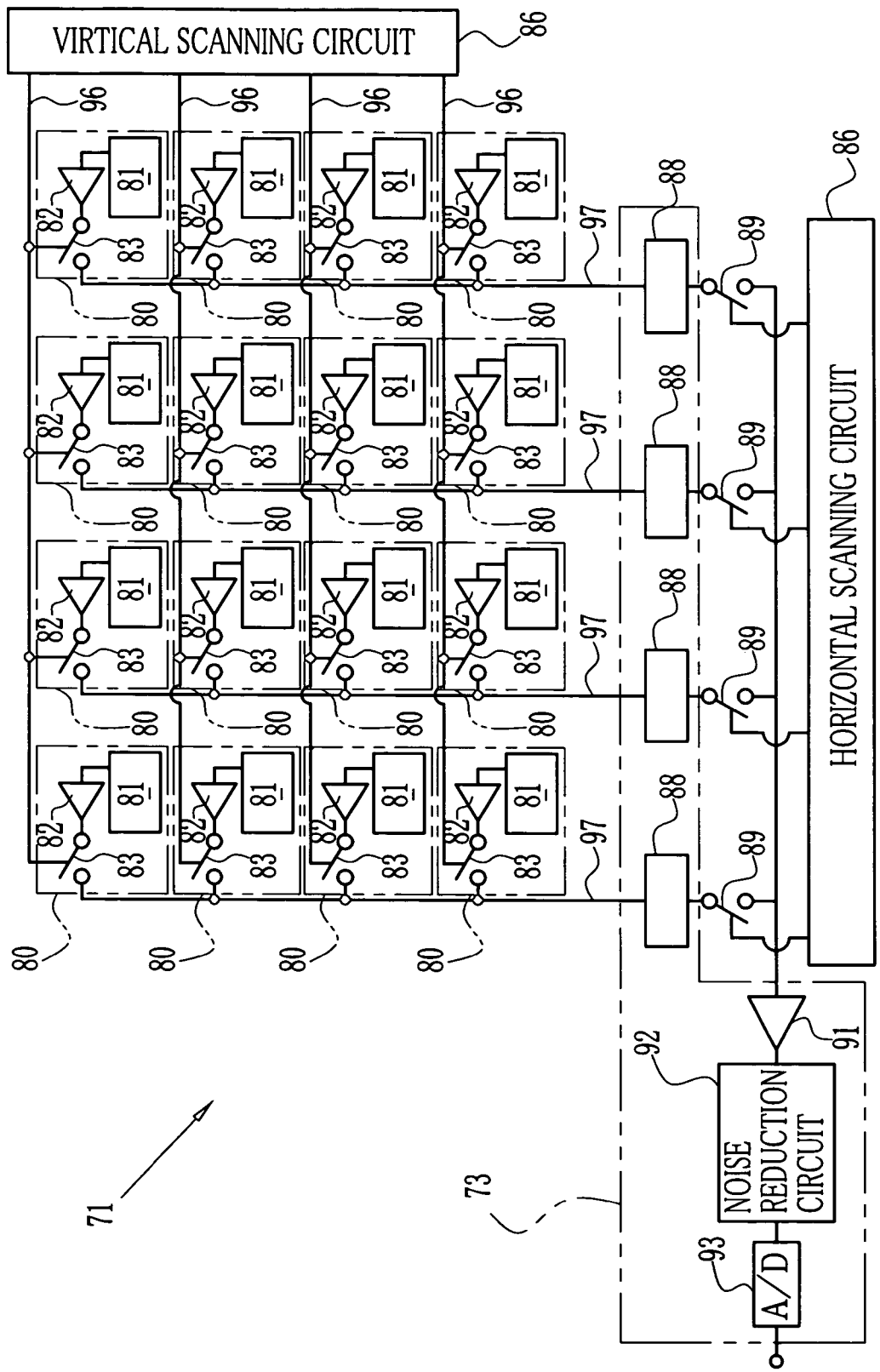
FIG. 6 is a block diagram of an electrical structure of a CMOS image sensor.

As shown in FIG. 6, the CMOS image sensor 71 includes pixels 80 arranged in a matrix form. Each pixel 80 is provided with a light receiving element 81, a pixel amplifier 82, a pixel selector gate 83 and the like. Additionally, the CMOS image sensor 71 includes a vertical scanning circuit 86, a horizontal scanning circuit 87, amp/noise reduction circuits 88, pixel column selector gates 89, the output amplifier 91, the noise reduction circuit 92, and the A/D converter 93.

The light receiving elements 81 are connected to the pixel amplifiers 82, which amplify and output the signal charges accumulated in the light receiving elements 81. Output terminals of the pixel amplifiers 82 are connected to the pixel selector gates 83. Connected through one of signal lines 96 to the vertical scanning circuit 86, each pixel selector gate 83 opens in response to a drive signal from the vertical scanning circuit 86 so that the pixel 80 is selected for vertical scanning.

The pixel selector gates 83 are also connected through signal lines 97 provided for each pixel column to one of the amp/noise reduction circuits 88 placed next to the pixel columns. The amp/noise reduction circuits 88 compensate the variation in the gain and offset of each pixel amplifier 82, and eliminate noise such as reset noise and 1/f noise. The output terminals of the amp/noise reduction circuits 88 are connected to the horizontal scanning circuit 87 through the pixel column selector gates 89 so that the pixel columns are selectively scanned.

When a pixel is selected for scanning by a control circuit (not shown), the signal charge in the light receiving element 81 is amplified by the pixel amplifier 82 and outputted as an image signal. The image signal from the pixel amplifier 82 is sent through the signal line 97 to the amp/noise reduction circuit 88. Then, the image signal is amplified by the output amplifier 91 and sent to the noise reduction circuit 92, where the image signal undergoes a noise reduction process by, for example, correlated double sampling (CDS). The image signal after the noise reduction process is converted by the A/D converter 93 into a digital signal and output as image data.

Meanwhile, there are different types of the CMOS image sensors such as one provided with column amps (which amplify each row) or column A/D converters (which digitize the signals of each raw). It is however noted that all the CMOS image sensors only differs in arrangement of the circuits and share the same constitution and operation.

In this embodiment, the radiation section 73 is disposed according to the positions of high heat generating components, such as the output amplifier 91, the amp/noise reduction circuits 88, the noise reduction circuit 92, and the A/D converter 93, so as to restrain the temperature rise of the device. The radiation section 73 is provided with a plurality of radiation fins 98, which are integrated with a light shielding film 99 that covers the output amplifier 91, the amp/noise reduction circuits 88, the noise reduction circuit 92, and the A/D converter 93. Similar to the previous embodiment, the radiation fins 98 and the light shielding film 99 are made from a metallic material, such as aluminum or tungsten, by the sputtering method or the etching method. The radiation fins 98 are formed into a rectangular column shape and aligned parallel to each other at regular intervals. Since the high heat generating components, such as the output amplifier 91, the amp/noise reduction circuits 88, the noise reduction circuit 92, and the A/D converter 93, are covered by the light shielding film 99 which has the integral radiation fins 98, the heat of the solid state imaging device 70 is dissipated effectively.

Figure 7:
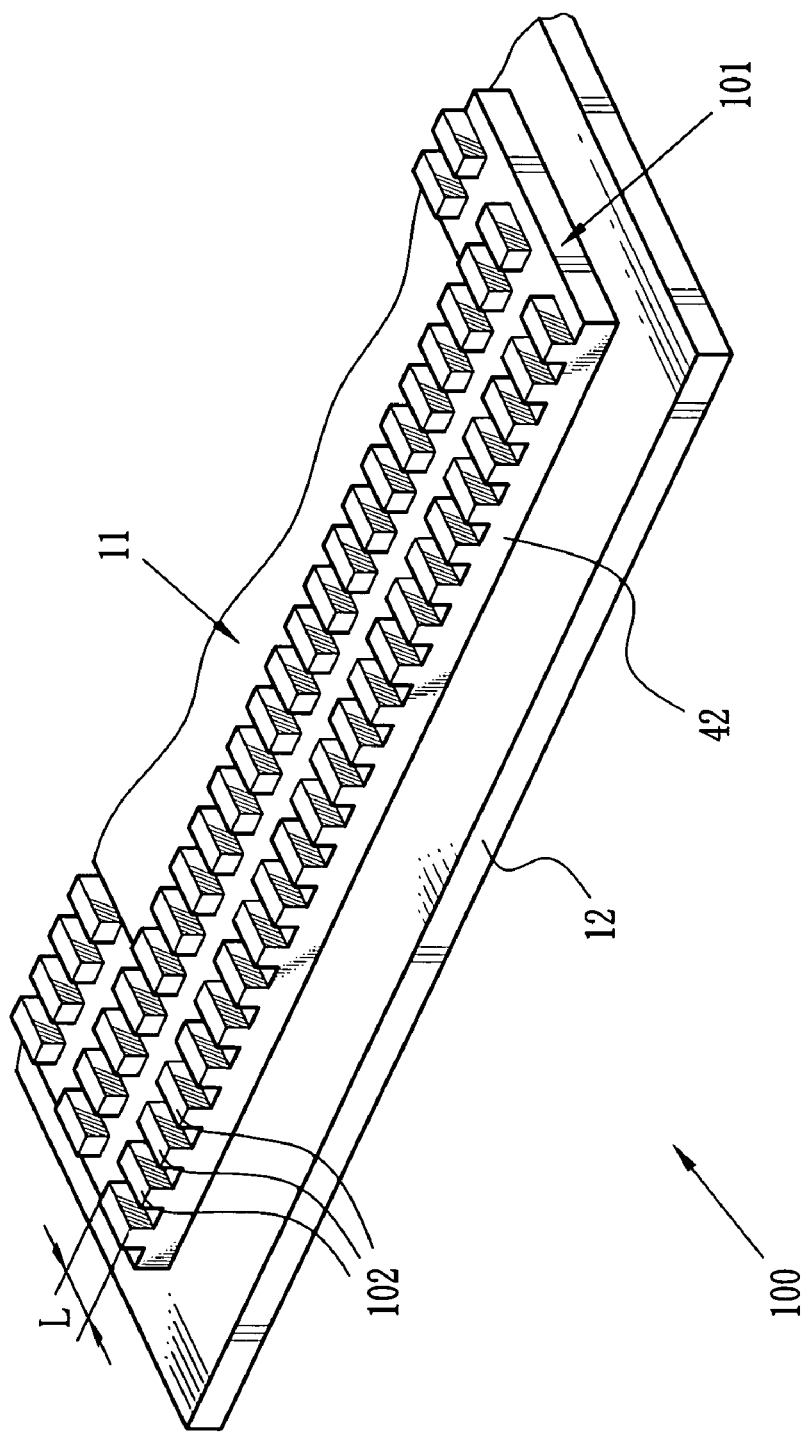
FIG. 7 is a perspective view of radiation fins arranged in several rows.
Figure 8:
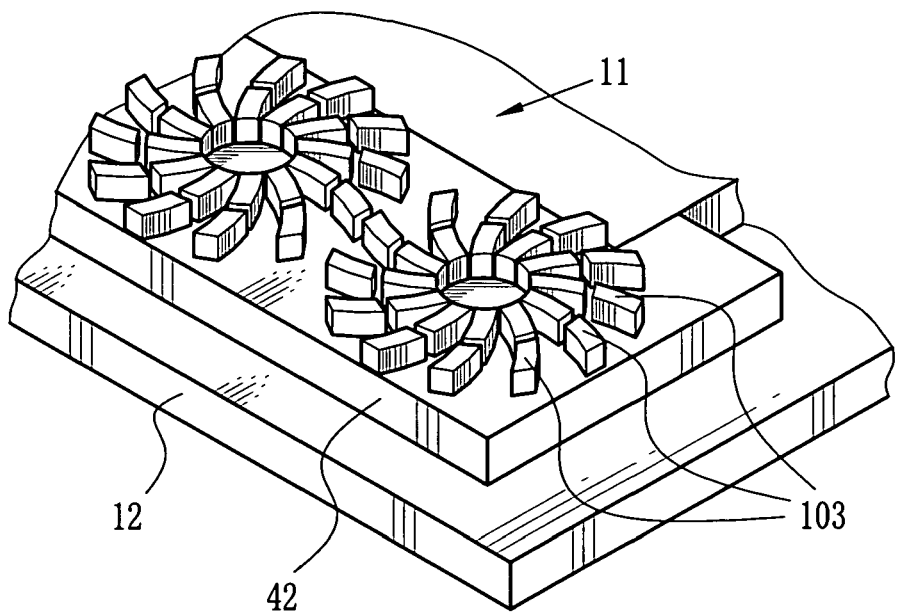
FIG. 8 is a perspective view of radiation fins in a spiral arrangement.
Figure 9:
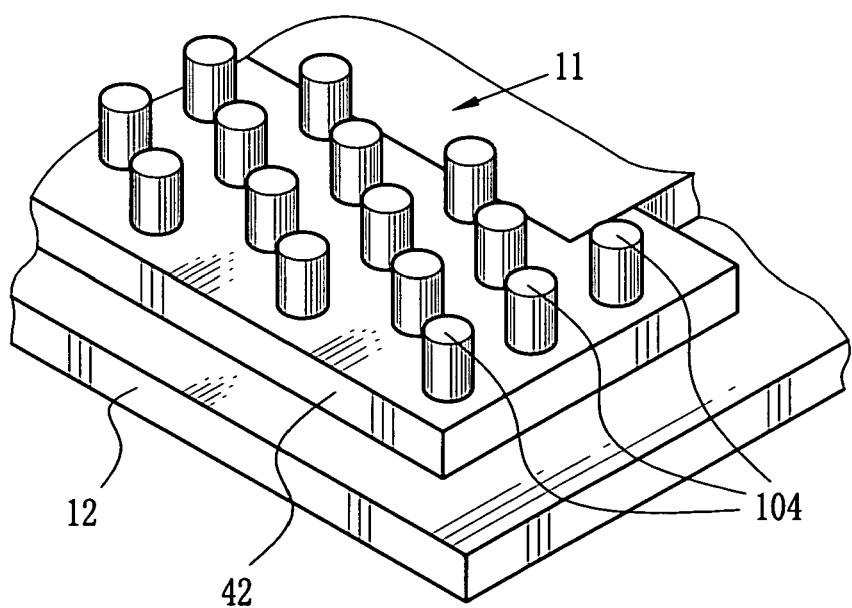
FIG. 9 is a perspective view of radiation fins of cylindrical shape.

Although the radiation fins 41 are formed into a rectangular column shape and aligned parallel to each other at regular intervals, they are not limited to this configuration but may be formed as those shown with a solid state imaging device 100 in FIG. 7. The solid state imaging device 100 includes a radiation section 101 having radiation fins 102. Formed to have an axial length L shorter than the radiation fins of the above embodiments, the radiation fins 102 are arranged in rows and columns at regular intervals. Similar to the above embodiments, the radiation fins 102 are integrated with the light shielding film 42. In addition, such as radiation fins 103 in FIG. 8, the radiation fins may take a spiral arrangement. Furthermore, the radiation fins are not necessarily of rectangular column shape, but may have a cylindrical shape standing upright on the light shielding film 42, such as radiation fins 104 in FIG. 9. The cylindrical radiation fins 104 can be formed by the well-known technique of Si—W—O whisker growth or carbon whisker growth with tungsten.

As described so far, the present invention is not to be limited to the above embodiments, and all matter contained herein is illustrative and does not limit the scope of the present invention. Thus, obvious modifications may be made within the spirit and scope of the appended claims.

What is claimed is:

1. A solid state imaging device comprising:
   a semiconductor substrate;
   an image sensor formed on said semiconductor substrate, said image sensor having a plurality of light receiving elements arranged in a matrix form;
   a light shield covering a part of said image sensor for light protection; and
   radiation fins formed integrally on said light shield,
   wherein the plurality of light receiving elements is formed on said semiconductor substrate, wherein said image sensor is a CCD image sensor which includes:
   vertical transfer electrodes for transferring signal charges accumulated in said light receiving elements in a vertical direction;
   horizontal transfer electrodes connected perpendicular to said vertical transfer electrodes, for transferring said signal charges transferred from said vertical transfer electrodes in a horizontal direction; and
   an output amplifier for amplifying and outputting said signal charges transferred from said horizontal transfer electrodes,
   wherein said light shield is formed according to the positions of said horizontal transfer path and said output amplifier so as to cover said horizontal transfer electrodes and said output amplifier, whereas said radiation fins are formed above said output amplifier.

2. A solid state imaging device as claimed in claim 1, wherein said radiation fins are also formed above said horizontal transfer electrodes.

3. A solid state imaging device as claimed in claim 1, wherein said image sensor is a CMOS image sensor which includes:
   pixel amplifiers for amplifying signal charges accumulated in said light receiving elements on a pixel basis and outputting said amplified signal charges as image signals;
   pixel selectors for selectively reading out said image signals sequentially on a pixel basis; and
   the output amplifier for amplifying said image signals read out by said pixel selectors.

4. A solid state imaging device as claimed in claim 3, wherein said CMOS image sensor further includes:
   a converter for converting said image signals from said output amplifier into digital data,
   wherein said light shield also covers said converter, whereas said radiation fins are also formed above said converter.

5. A solid state imaging device as claimed in claim 3, wherein said CMOS image sensor further includes:
   a noise reduction processor for applying a noise reduction process to said image signals out of said output amplifier; and
   a converter for converting said image signals after said noise reduction process into digital data,
   wherein said light shield also covers said noise reduction processor and said converter, whereas said radiation fins are also formed above said noise reduction processor and said converter.

6. A solid state imaging device as claimed in claim 1, wherein said radiation fins are of rectangular column shape and aligned parallel to each other at a regular interval.

7. A solid state imaging device as claimed in claim 6, wherein said interval P (mm) satisfies the following equation $$P = 5 \times \left(\frac{H}{\Delta T}\right)^{0.25}$$

wherein H (mm) represents the height of said radiation fin, whereas ΔT (° C.) represents an average temperature rise of said light shield.

8. A solid state imaging device as claimed in claim 1, wherein said radiation fins are of rectangular column shape and arranged in a spiral form.

9. A solid state imaging device as claimed in claim 1, wherein said radiation fins are of cylindrical shape.

10. A solid state imaging device as claimed in claim 1, wherein the radiation fins are formed directly above the part of said image sensor covered by the light shield for light protection.

11. A solid state imaging device as claimed in claim 1, wherein the radiation fins are formed above the part of said image sensor covered by the light shield for light protection.

12. A solid state imaging device as claimed in claim 1, wherein the radiation fins are formed on the light shield above said image sensor.

13. A solid state imaging device as claimed in claim 1, wherein the light shield covering the part of said image sensor is provided on the same side as a light reception area of the image sensor.

14. A solid state imaging device as claimed in claim 1, wherein the plurality of light receiving elements, the vertical transfer electrodes, the horizontal transfer electrodes and the output amplifier are formed directly on said semiconductor substrate.

15. A solid state imaging device as claimed in claim 1, wherein the radiation fins are integrally formed on the light shield such that heat from heat generating components provided on the image sensor is dissipated individually.

16. A solid state imaging device as claimed in claim 1, wherein the radiation fins are integrally formed on the light shield such that heat from a first heat generating component provided on the image sensor is dissipated independent of a heat dissipation of another component the image sensor.

17. A solid state imaging device as claimed in claim 1, wherein said radiation fins are formed only directly above said output amplifier.

18. A solid state imaging device as claimed in claim 1, wherein said light shield is formed only in areas of said horizontal transfer path and said output amplifier.

* * * * *